United States Patent [19]

Lockwood et al.

[11] Patent Number: 4,898,834
[45] Date of Patent: Feb. 6, 1990

[54] OPEN-TUBE, BENIGN-ENVIRONMENT ANNEALING METHOD FOR COMPOUND SEMICONDUCTORS

[75] Inventors: Arthur H. Lockwood, Goleta; Adela Gonzales, Santa Barbara, both of Calif.

[73] Assignee: Amber Engineering, Inc., Goleta, Calif.

[21] Appl. No.: 211,839

[22] Filed: Jun. 27, 1988

[51] Int. Cl.⁴ .......................................... H01L 21/265
[52] U.S. Cl. ................... 437/22; 148/DIG. 3; 148/DIG. 5; 148/DIG. 22; 148/DIG. 84; 437/26; 437/247; 437/734; 437/945; 437/949; 437/987
[58] Field of Search .................. 148/DIG. 34, 5, 6, 15, 148/21, 22, 24, 30, 36, 65, 57, 76, 79, 83, 84, 127, 172; 156/610-615; 357/29-32, 91; 437/2, 3, 5, 22, 23, 25, 51, 54, 81, 82, 87, 102, 104, 170, 173, 174, 247, 916, 926, 934, 945, 949, 987

[56] References Cited

U.S. PATENT DOCUMENTS

| | | | |
|---|---|---|---|
| 3,945,110 | 3/1976 | Honsperger et al. | 437/3 |
| 4,080,721 | 3/1978 | Hung | 437/22 |
| 4,128,681 | 12/1978 | Kotera et al. | 437/84 |
| 4,174,982 | 11/1979 | Immorlica, Jr. | 437/22 |
| 4,312,681 | 1/1982 | Rupprecht et al. | 437/22 |
| 4,401,487 | 8/1983 | Lockwood | 156/624 |
| 4,482,423 | 11/1984 | Besomi et al. | 156/622 |
| 4,544,417 | 10/1985 | Clarke et al. | 437/22 |
| 4,576,652 | 3/1986 | Hovel et al. | 437/22 |
| 4,696,094 | 9/1987 | Yves et al. | 437/33 |
| 4,713,354 | 12/1987 | Egawa et al. | 437/247 |
| 4,772,489 | 9/1988 | Shikuta | 437/170 |
| 4,795,717 | 1/1989 | Okamura | 437/176 |

OTHER PUBLICATIONS

Kasahara et al., "Effect of Arsenic Partial Pressure on Capless Anneal of Ion—Implanted GaAs," J. Electrochem. Soc., vol. 126, No. 11, Nov. 1979, pp. 1997-2001.

Primary Examiner—Brian E. Hearn
Assistant Examiner—William Bunch
Attorney, Agent, or Firm—Spensley Horn Jubas & Lubitz

[57] ABSTRACT

An improved system and method for annealing indium antimonide ion implanted junctions employing an open-tube benign annealing environment. A furnace having a hollow chamber therein is maintained continuously at a predetermined annealing temperature and wafers of indium antimonide to be annealed are inserted into the chamber through a resealable airlock at one end of the chamber. A source of molten indium saturated with antimony is provided within the chamber to maintain desired partial pressures of indium and antimony within the chamber. Hydrogen gas is continuously flushed through the chamber to purge contaminants and maintain the chamber at a desired slight overpressure over atmospheric. At the conclusion of annealing, the indium antimonide wafer is removed from the chamber into the airlock which is flushed with hydrogen gas. The wafer is allowed to cool to room temperature and removed from the airlock for subsequent processing steps.

13 Claims, 3 Drawing Sheets

OPEN-TUBE, BENIGN-ENVIRONMENT ANNEALING METHOD FOR COMPOUND SEMICONDUCTORS

BACKGROUND OF THE INVENTION

1. Field of the Invention

The present invention relates to processing of semiconductor materials. More particularly, the present invention relates to processing of indium antimonide.

2. Description of The Prior Art and Related Information

Various semiconductor compounds having existing or emerging commercial applications are not suitable for standard silicon processing technologies. In particular, indium antimonide (InSb) has increasing commercial interest but is unsuited for conventional semiconductor processing. For example, one application of InSb is for use in detection of infrared radiation. In such applications, large arrays of InSb photodiode integrated circuits are commonly employed and each InSb photodiode integrated circuit in turn contains an array of many individual diodes. Due to the high performance characteristics required for most commercial applications of InSb infrared detectors, constraints are placed on the InSb photodiodes that are difficult to simultaneously realize. Specifically, the individual photodiode junctions must provide both high performance and uniformity. InSb infrared detectors having the highest performance characteristics are fabricated by the thermal diffusion process; i.e., the dopant used to create the photodiode junction is diffused into the InSb crystal structure. This process minimizes damage to the crystal structure and provides good performance characteristics. On the other hand, the InSb detectors having the most uniform diode arrays are fabricated by ion implanting the dopant. The ion implantation step causes damage to the InSb crystal structure, however, thereby degrading the performance characteristics of the diode. Accordingly, to maximize both performance and uniformity of the InSb photodiode array, either the uniformity of the diodes formed by the diffusion process must be enhanced or the performance of the diodes formed by the ion implant process must be enhanced.

To enhance the performance of ion implanted InSb photodiode arrays, an annealing process has been employed that improves the performance of the ion implanted InSb photodiodes by repairing the damage to the crystal structure caused by the ion implantation. Due to the relatively high vapor pressure of InSb, however, the ion implanted InSb photodiode junctions cannot be annealed in a typical annealing step such as is normally employed for silicon integrated circuit processing. If such an annealing step were performed in vacuum, or in any other open environment such as in silicon integrated circuit processing, the surface of the InSb photodiode would be seriously pitted by the tendency of the elemental indium and antimony to evaporate out of the crystal. Accordingly, prior art methods for annealing InSb photodiode arrays have employed closed capsule annealing methods to prevent evaporation of the elemental indium and antimonide from the crystal structure during the annealing process.

In FIG. 1, a prior art closed ampoule annealing method for curing ion implantation damage in InSb photodiode arrays is illustrated. Referring to FIG. 1(a) a quartz ampoule 10 is isometrically illustrated with two InSb wafers 12, 14 shown resting on a wafer support tray 16 mounted horizontally within the ampoule 10. Also positioned on the wafer support tray 16 is a quartz cup 18 for holding elemental antimony which will be vaporized during the annealing process and provide a background partial pressure of antimony in the ampoule. A second quartz cup (not shown) for holding elemental indium may also be employed. The amount of elemental antimony in quartz cup 18 is chosen so as to provide the desired partial pressure of antimony at the annealing temperature. In practice, however, the actual amount of elemental antimony employed provides only approximately the desired partial pressure at the wafer surface due to temperature variations along the capsule as a function of heating and cooling time. Therefore, since the actual partial pressure in the ampoule during annealing only approximates the desired amount, some thermal micropitting does occur. Also shown in FIG. 1(a) is an evacuation tube 20 attached to one end 21 of ampoule 10. As shown, ampoule end 21 is initially separated from the remainder of ampoule 10 to allow for loading of the wafers 12 and 14 and elemental antimony. As shown in FIG. 1(b), once the InSb wafers 12 and 14 and antimony cup 18 are inserted into the ampoule 10 the two parts of ampoule 10 are sealed at a butt seal 22. Ampoule 10 is chosen sufficiently long such that the heat generated during sealing along butt seal 22 will not result in heating of wafers 12 and 14. After sealing ampoule 10 is evacuated through evacuation tube 20. In FIG. 1(c) ampoule 10 is illustrated with the vaccuum tube 20 removed and the opening sealed, ready for insertion of the ampoule 10 into a furnace for annealing. The ampoule 10 is placed in a furnace at an elevated temperature, in the range 200° C.–475° C., for times of the order of 15 minutes to 2 hours. After the prescribed annealing time, the ampoule is quenched, i.e. rapidly cooled to room temperature. After quenching the ampoule 10 is broken open as illustrated in FIG. 1(d), to remove the annealed InSb wafers 12 and 14.

The ampoule annealing method described above suffers from a number of disadvantages. First of all, although the elevated temperature in the closed ampoule can supply the energy necessary to heal dislocation damage in the crystal structure of the InSb wafer caused by the implant process, the environment at the surface of the wafer is not ideal. This allows thermal micropitting to occur, which limits the performance of the ion implanted photodiode. To minimize this thermal micropitting the closed ampoule anneal is limited to times that are too short and temperatures that are too low to completely remove the damage to the crystal from the ion implanting step. Thus, the closed ampoule process not only results in new damage to the implanted layer, but also does not completely remove the damage that the annealing process is meant to eliminate. Such new and residual crystal structure damage is the reason why prior art ion implanted photodiode InSb arrays have reduced performance characteristics relative to diffusion fabricated arrays.

Secondly, the vaporized indium and/or antimony in the ampoule will unavoidably be deposited on the wafer surface by condensation during the quenching process. This unwanted deposition on the wafer surface can cause loss of the desired diode performance characteristics and can also cause the wafers to be visually rejected for subsequent fabrication steps.

Additionally, the closed quartz ampoule annealing process is commercially undesirable. The process is both expensive and unsuited for large scale commercial production. Each time an anneal is to be performed a quartz ampoule needs to be fabricated in two parts. The two parts then need to be carefully cleaned, assembled around the wafers, evacuated, placed in a furnace, annealed, quenched, and broken open. The ampoule assembly and cleaning steps are time consuming and require highly skilled personnel. While the time involved in actually annealing at elevated temperature is only approximately an hour, the other preparation steps typically require the best part of a day. Therefore, large scale production of high quality ion implanted InSb photodiode wafer arrays by the closed ampoule annealing method would be prohibitively time consuming and expensive. Without annealing, however, the relatively poor performance characteristics of ion implanted photodiode arrays requires compensation by additional cryogenic cooling to relatively lower temperatures. The extra cost of such additional cryogenic equipment may amount to millions of dollars in system costs.

Accordingly, a need presently exists for improving the performance characteristics of ion implanted photodiode arrays in a commercially viable manner.

SUMMARY OF THE INVENTION

The present invention provides a system and method for forming high quality ion implanted indium antimonide junctions, and in particular indium antimonide photodiode arrays, which are suitable for commercial applications.

The present invention provides an open-tube, benign environment system and method for annealing ion implanted indium antimonide junctions. In a preferred embodiment, the present invention employs a conventional furnace to provide the desired annealing temperature. The furnace has a central cavity in which is mounted a hollow stainless steel chamber of size suitable for receiving indium antimonide wafers to be annealed. One end of the chamber is sealed while the other end is equipped with an airlock to allow access of the wafers to the chamber without loss of the atmosphere within the chamber or entry or contaminants into the chamber. The chamber is provided with a source of indium and antimony vapor such as a quartz crucible which contains molten indium saturated with antimony, approximately 10% antimony by weight. The furnace is kept at the desired wafer annealing temperature at all times thereby maintaining an environment in the chamber where the molten indium and antimony mix in the quartz crucible is at equilibrium with the indium and antimony vapor at their respective vapor pressures. Additionally, the chamber is continuously purged with ultra high purity hydrogen gas at a slight overpressure, for example 0.3 pounds per square inch over atmospheric, to prevent contaminants from entering the chamber. The hydrogen also provides a reducing atmosphere which aids in reducing oxides at the surface of the indium antimonide wafers.

The indium antimonide wafers to be annealed are introduced into the chamber through the airlock and held in the chamber at the annealing temperature for a period suitable to anneal the crystal damage from the ion implantation step. For example, 400° C. is a suitable annealing temperature and an annealing time of approximately one-half hour would be suitable at this temperature. Other temperatures are possible however, generally within the range 315° C. to 475° C., with the annealing time varying with the temperature. Due to the equilibrium indium and antimony partial vapor pressures in the chamber, thermal micropitting of the surface of the wafer is substantially avoided and full annealing of the crystal damage possible. Upon completion of the annealing step, the wafers may be quickly removed from the chamber, and the indium-antimony-hydrogen annealing environment in the chamber, through the airlock thereby avoiding any condensation of the indium and antimony vapor onto the surface of the wafer. Due to the continuous operation of the furnace at the annealing temperature and the relative ease of entry and removal of the wafer through the airlock, a relatively high throughput of wafers is possible.

Accordingly, the present invention provides a commercially viable system and method for annealing the crystal damage in ion implanted indium antimonide junctions. In a preferred embodiment this may provide high performance and high uniformity photodiode arrays for use as infrared detectors.

BRIEF DESCRIPTION OF THE DRAWINGS

FIG. 6(a) and FIG. 6 (b) are a top view and cross-sectional view, respectively, of an annealed ion implanted photodiode having contact regions formed thereon.

DETAILED DESCRIPTION OF THE INVENTION

Figure 1A:
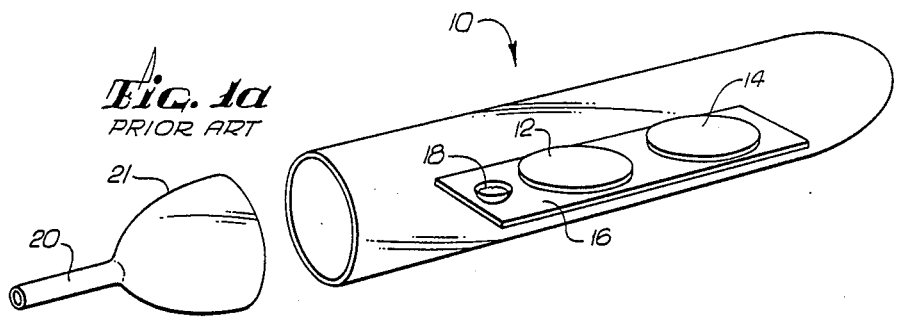
FIGS. 1(a), 1(b), 1(c) and 1(d) are drawings illustrating a prior art ampoule annealing method for curing ion implantation damage in indium antimonide photodiode arrays.
Figure 1B:
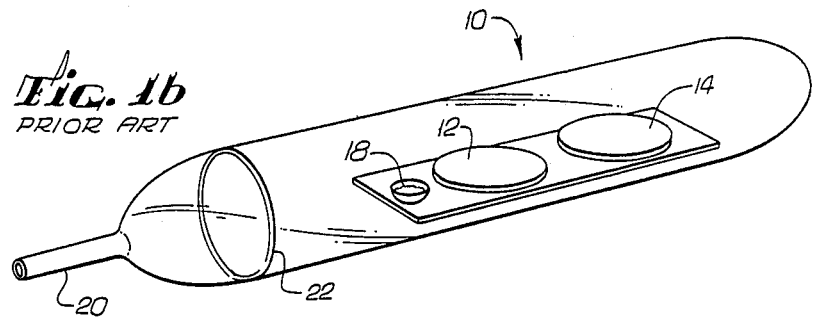
Figure 1C:
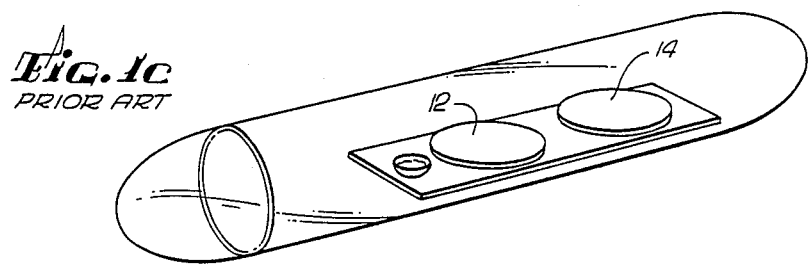
Figure 1D:
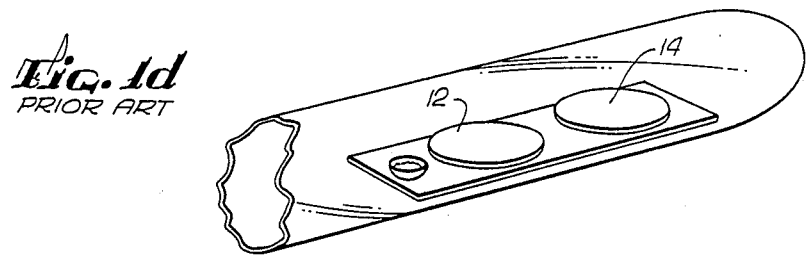
Figure 2A:
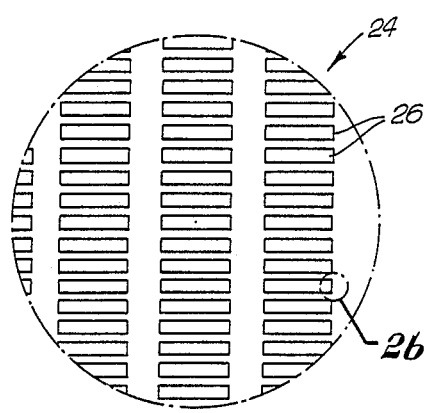
FIG. 2 (a) and FIG. 2(b) are overhead views of a wafer of indium antimonide ion implanted photodiodes.
Figure 2B:
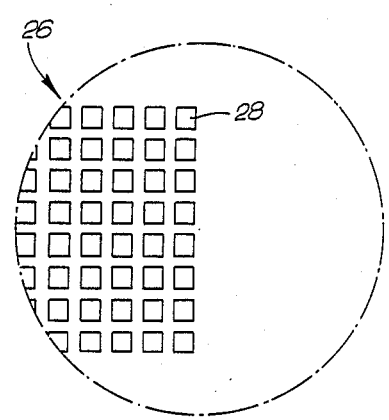

In a preferred embodiment, the present invention provides an improved system and method for annealing ion implanted indium antimonide (InSb) junctions, and in particular, InSb ion implanted photodiode arrays. For convenience of processing and throughput, InSb photodiode arrays are typically processed on relatively large InSb wafers, for example 1.25 inches in diameter, containing a large number of individual InSb photodiode array integrated circuits. In FIG. 2(a) such an InSb wafer 24 containing a plurality of InSb photodiode integrated circuits 26 is shown in a top view. In FIG. 2(b) a portion of a single InSb integrated circuited 26 is illustrated in an enlarged view. As shown in FIG. 2(b) each integrated circuit 26 is made up of a large number of individual InSb photodiodes 28 arranged in an array.

Commercial applications of InSb photodiode arrays, for example in Infrared Focal Plane Arrays (IRFPA), typically have very demanding performance characteristics. In order to provide an InSb photodiode array in commercial quantities with the characteristics required the individual integrated circuits 26 must have good performance characteristics and high uniformity as well as high wafer yield. Although good uniformity characteristics may be obtained by employing ion implantation to form the photodiode junction the ion implantation degrades the crystal structure and reduces performance. The performance characteristics are maintained in such ion implanted photodiodes by curing any damage to the InSb crystal structure by a subsequent annealing step.

Figure 3:
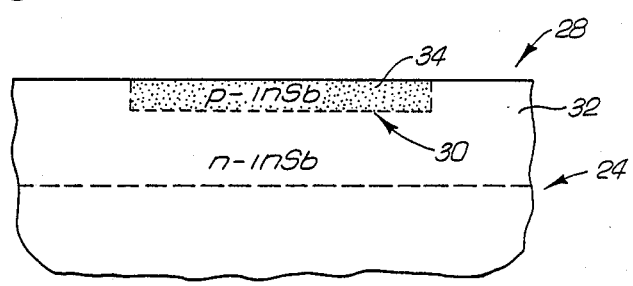
FIG. 3 is a cross-sectional drawing of a portion of the wafer of FIG. 2 illustrating a single ion implanted junction.

Referring to FIG. 3 the basic structure of the ion implanted photodiode junction within each photodiode 28 is illustrated. FIG. 3 shows a cross-section through a portion of InSb wafer 24 illustrating an ion implanted photodiode junction 30. The photodiode junction 30 is formed in the top surface of InSb wafer 24 which is of n-type conductivity. Typically InSb wafers when formed are inherently n-type and no doping of the InSb wafer is needed to make wafer 24 n-type. Alternatively, if the InSb wafer is not sufficiently n-type, epitaxial layer 32 may be formed by growing an InSb layer containing a suitable dopant onto InSb wafer 24. The photodiode junction 30 is formed by using ion implantation of a suitable p-type dopant, such as beryllium, into n-type layer 32, to form p-type region 34. Due to the ability to closely control the doping profile through ion implantation, region 34 has highly uniform electrical properties. The ion implantation step introduces damage to the crystal structure of the p-type InSb in region 24 which, however, degrades the performance characteristics of the photodiode. Accordingly, after implantation of regions 34 in wafer 24, an annealing step is necessary to cure the crystal damage and restore the good performance characteristics of the photodiode junction.

Figure 4:
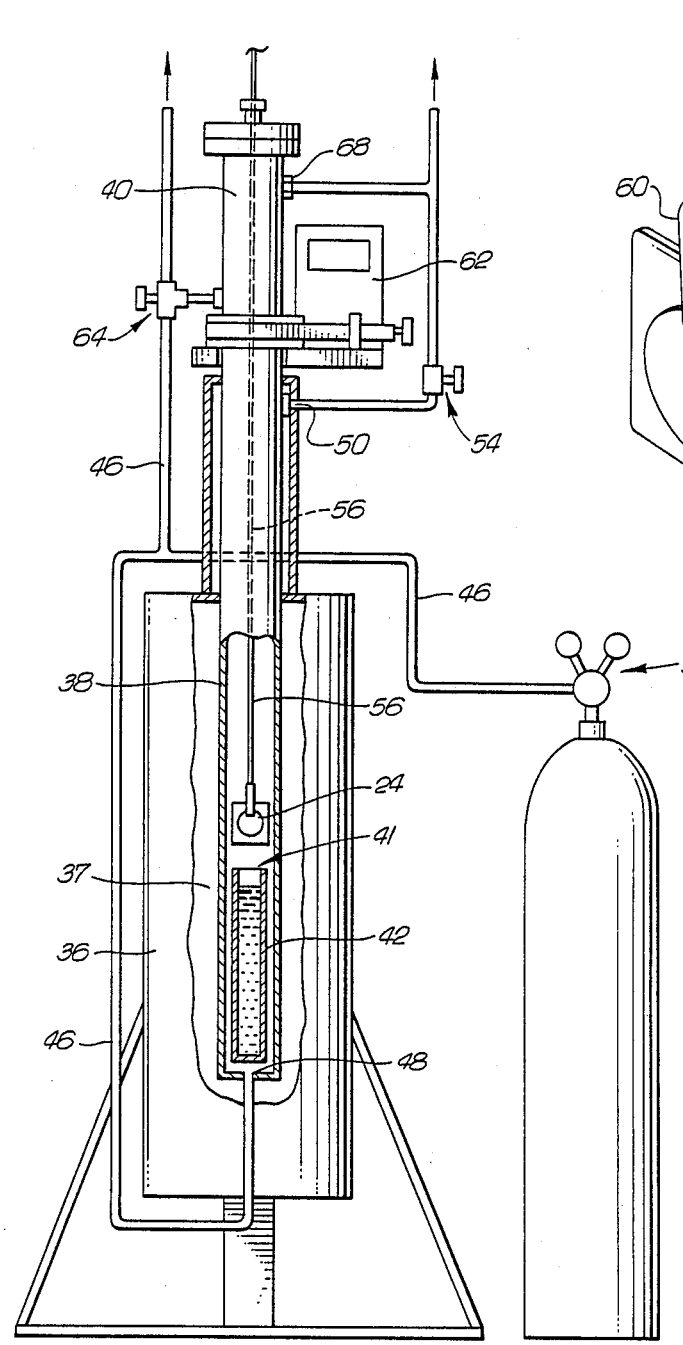
FIG. 4 is a cutaway view of a preferred embodiment of the open-tube annealing system of the present invention.

Referring to FIG. 4, a preferred embodiment of the open-tube, benign-environment annealing system of the present invention is illustrated. The annealing system of FIG. 4 employs a furnace 36 for providing the desired annealing temperature. Furnace 36 is preferably of a 13 zone type, however, furnace 36 could have more or less than 13 zones while providing suitable annealing parameters. A commercially available furnace may conveniently be employed, for example, the Astro model A-138 furnace is suitable for providing the annealing temperatures and accomodating the wafer sizes in a preferred embodiment of the present invention. As illustrated in FIG. 4, furnace 36 has a vertical structure with a vertical central cavity 37 in which is mounted the bottom portion of a stainless steel cylindrical chamber 38. The furnace and chamber size and shape may be modified from that illustrated in FIG. 4, however. For example, the vertical orientation maybe modified to a horizontal orientation with suitable modifications to the chamber/furnace orientations. At the top of chamber 38 an airlock 40 is provided to provide controlled access of the wafers to be annealed to chamber 38.

Positioned within stainless steel chamber 38 is a source of elemental indium and antimony vapor 41. In a preferred embodiment a quartz crucible 42 which contains molten indium saturated with antimony may be employed. During operation furnace 36 is continuously maintained at the desired annealing temperature which maintains the indium in crucible 42 in a molten state. A sufficient amount of antimony is added to crucible 42 to saturate the molten indium, approximately 10% antimony by weight. This provides a constant partial pressure of indium and antimony in the sealed chamber 38 which environment is optimum for preventing thermal micropitting of the InSb wafers during annealing.

A source of ultra-pure hydrogen gas 44, illustrated by a tank in FIG. 4, is coupled to chamber 38 and airlock 40 through feed tubing 46. The hydrogen gas is fed into chamber 38 through access port 48 and flows upward through chamber 38 and exits the chamber 38 through a vent 50 at the top of chamber 38. The flow of the hydrogen gas through the chamber 38 may be readily controlled by two valves 52,54. This upward flow of hydrogen continuously purges the environment of chamber 38 from any contaminants. The hydrogen gas is preferably provided at a pressure such as to maintain the pressure within chamber 38 at a slight overpressure with respect to atmospheric. For example, approximately one third pound per square inch over atmospheric is suitable. This slight overpressure further reduces the tendency of contaminants to enter into chamber 38. Additionally, the near atmospheric pressure of the hydrogen-indium-antimony environment within chamber 38 is much easier to work with than the low partial pressures of indium and antimony. Additionally, the hydrogen gas in the chamber 38 reduces the surface of the wafer to be annealed and contributes to the lack of thermal micropitting during the annealing step. While hydrogen gas is preferred, another inert gas such as argon could also be used in place of hydrogen.

Figure 5:
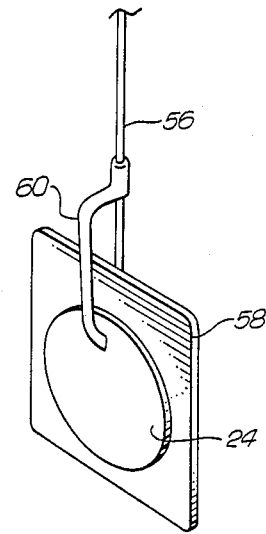
FIG. 5 is a cross-sectional drawing illustrating one means for supporting the indium antimonide wafer within the furnace shown in FIG. 4.

As illustrated schematically in FIG. 4, and in detail in FIG. 5, InSb wafer 24 is suspended in chamber 38 during annealing by a long, wafer-suspension rod 56. As shown in FIG. 5, suspension rod 56 is attached to a wafer insertion fixture 58 which may be simply a thin flat platform of material with a suitably high melting temperature. For example, both rod 56 and insertion fixture 58 may be made of quartz. The InSb wafer to be annealed 24 is mounted to the insertion fixture 58 by means of a quartz spring 60, the fixed end of quartz spring 60 being attached to suspension rod 56. This thus provides a simple means for holding the InSb wafer 24 in place without damage while it is inserted through the airlock 40 and into the chamber 38. The insertion fixture 58 is also provided with a thermocouple (not shown) positioned immediately behind the InSb wafer 24 with an electrical lead running up through suspension rod 56. This thus provides accurate monitoring of the temperature within chamber 38 at the precise position of InSb wafer 24. The furnace 36 may be maintained at the desired annealing temperature by supplying the thermocouple temperature information to a furnace control microprocessor 62, shown in FIG. 4. For example, a commercially available Thermoelectric Digital Microprocessor is suitable for controlling the temperature of furnace 38.

In operation, InSb wafer 24 to be annealed is first attached to the insertion fixture 58 by means of spring 60 as illustrated in FIG. 5. The airlock 40, shown in FIG. 4, is then evacuated and purged with hydrogen gas via supply tube 46 and vents 64 and 68. Wafer 24 is then lowered into the chamber 38 to a position above crucible 42 having the desired temperature as determined by the thermocouple. For annealing InSb wafers, a suitable annealing temperature is 400° C. However, other temperatures within the range 315° C. to 475° C. may also be employed for annealing InSb. (535° C. constitutes the melting point of InSb and accordingly is a maximum limit for annealing.) The InSb wafer 24 is maintained in the benign annealing environment of chamber 38 for a desired annealing time; for example, one half hour is suitable for an annealing temperature of 400° C. Increasing or decreasing the annealing temperature will result in decreased or increased annealing times, respectively. After the prescribed annealing time, wafer 24 is removed from the chamber 38 into the airlock 40. Airlock 40 is again flushed with hydrogen gas via vents 64 and 68 to remove the residual indium and antimony vapor and wafer 24 is allowed to cool to room temperature. Airlock 40 is then vented to room atmosphere and the wafer 24 is removed for subsequent processing.

Due to the ability to quickly remove the InSb wafers 24 from the hydrogen-indium-antimony annealing environment in chamber 38, followed by subsequent flushing of residual indium or antimony vapor, the deposition of these elements on the surface of wafer 24 is avoided. Thus the rejection of InSb wafers and the degradation of InSb photodiode junction performance characteristics which results from the deposition of indium and antimony during the quenching process in closed ampoule annealing is avoided. Furthermore, the ability to maintain a benign annealing environment having an ambient atmosphere saturated with indium and antimony vapor minimizes thermal micropitting in the surface of the InSb wafer 24 which otherwise would occur due to the tendancy of indium and antimony to evaporate from the crystal. Also, the total pressure in the chamber 38 may be carefully controlled and a reducing atmosphere provided to produce an essentially ideal annealing environment within chamber 38. As a result, the performance characteristics of the annealed photodiode junctions are greatly improved while maintaining the uniformity resulting from the ion implantation of the photodiode junctions.

Figure 6:
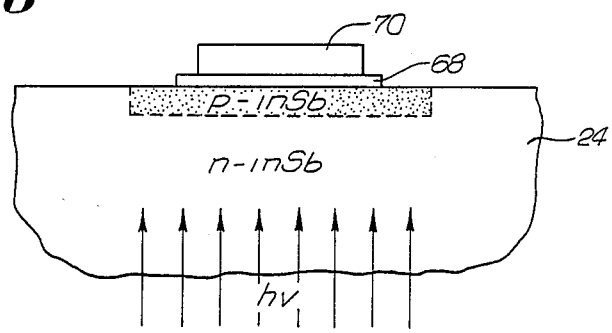

In FIG. 6 the post annealing steps of contact formation on the photodiodes are illustrated. For a typical photodiode array such as illustrated in FIGS. 2(a) and 2(b) the n-type InSb wafer 24 will be applied with a common potential, for example ground, through a single contact or common contact (not shown). The individual photodiodes in the array will each in turn be provided with an electrical contact layer 68 to complete the two terminal diode connections. An additional layer of indium 70 is provided on top of the contact metal layer 68 to allow so-called "bump bonding" of the photodiode integrated circuit to a signal processing integrated circuit chip such as typically employed in IRFPA applications. The incoming infrared radiation detected by the photodiode junction is illustrated in FIG. 6 entering the junction area through the bottom of the chip.

While the foregoing description of the preferred embodiment of the present invention has used specific structural, electrical and material descriptions, it will be appreciated by those skilled in the art that many variations are possible while remaining within the scope of the present invention. For example, various alternate means of configuring the furnace, chamber, airlock, and quartz receptacle in the annealing system of the present invention are possible as determined by space requirements and various other requirements related to the specific commercial application. Additionally, a wide variation in specific processing times and temperatures is possible while retaining the advantages of the annealing method of the present invention. Furthermore, while the preferred embodiment of the present invention has been described in relation to annealing of InSb photodiodes, other applications of the annealing system and method of the present invention are possible. Accordingly, the present invention should not be limited to the preferred embodiment described above.

What is claimed is:

1. A method for annealing ion implanted junctions in indium antimonide wafers, employing a furnace having resealable means for accessing said furnace, comprising the steps of:

maintaining said furnace at a predetermined annealing temperature;

providing an indium-antimony atmosphere within said furnace, said indium and antimony being provided at their equilibrium vapor pressure at said annealing temperature;

inserting said wafer into said furnace and into contact with said atmosphere through said resealable means for accessing said furnace;

maintain said wafer in said furnace for a predetermined annealing time; and removing said wafer from said furnace and said atmosphere through said resealable means for accessing at the end of said predetermined time while maintaining said indium-antimony atmosphere within said furnace.

2. A method for annealing as set out in claim 1, wherein said annealing temperature is in the range 315° C. to 475° C.

3. An annealing method as set out in claim 1, wherein said predetermined annealing temperature is 400° C. and said predetermined annealing time is one half hour.

4. A method for annealing as set out in claim 1, further comprising the step of continuously flushing said furnace with hydrogen gas.

5. A method for annealing as set out in claim 1, further comprising providing hydrogen gas within said furnace at approximately ½ pounds per square inch over atmospheric.

6. A method for annealing as set out in claim 1, wherein said indium antimony atmosphere is provided by a molten solution of indium and antimony.

7. A method for annealing as set out in claim 6, wherein said wafer is positioned within said furnace at a position adjacent to, and above, said molten solution of indium and antimony.

8. A method for annealing as set out in claim 6, wherein said wafer is maintained at substantially the same temperature as said molten solution of indium and antimony during said predetermined annealing time.

9. A method for annealing ion implanted junctions of compound semiconductor material wafers employing a furnace having resealable means for accessing said furnace, comprising the steps of:

maintaining said furnace at a predetermined annealing temperature;

providing a molten solution of said compound semiconductor material within said furnace, said solution providing a source of an atmosphere of the compound semiconductor constituents at their equilibrium vapor pressure at said annealing temperature;

inserting said wafer into said furnace and into contact with said atmosphere through said resealable means for accessing said furnace;

maintaining said wafer in said furnace for a predetermined annealing time at substantially the same temperature as the molten source; and removing said wafer from said furnace through said resealable means for accessing at the end of said predetermined time.

10. A method for annealing as set out in claim 9, wherein said wafer is inserted into said furnace through said resealable means for accessing said furnace to a position adjacent to and above said source.

11. A method for annealing as set out in claim 1, wherein said furnace is maintained at said annealing temperature during said step of removing said wafer from said furnace.

12. A method for annealing as set out in claim 9, wherein said furnace is maintained at said annealing temperature during said step of removing said wafer from said furnace.

13. A method for annealing as set out in claim 1, wherein said resealable means for accessing said furnace includes a chamber having a gas inlet port, and a gas outlet port and resealable means connecting said chamber to the interior of said furnace and means for accessing said chamber from outside, wherein said step of removing said wafer from said furnace comprises the steps of removing said wafer from said furnace into said chamber and further comprising the step of removing any residual indium-antimony vapor from said chamber by providing flow of a neutral gas into said chamber through said gas inlet port and exhausting said neutral gas and said residual indium-antimony vapor through said outlet port.

* * * * *